(12) United States Patent
Yamazaki et al.

(10) Patent No.: US 7,943,968 B1
(45) Date of Patent: May 17, 2011

(54) CHARGE TRANSFER SEMICONDUCTOR DEVICE AND MANUFACTURING METHOD THEREOF

(75) Inventors: Shunpei Yamazaki, Tokyo (JP); Satoshi Teramoto, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1826 days.

(21) Appl. No.: 08/994,038

(22) Filed: Dec. 18, 1997

(30) Foreign Application Priority Data

Dec. 24, 1996 (JP) .................................. 8-356229

(51) Int. Cl.
*H01L 27/148* (2006.01)
*H01L 21/00* (2006.01)
(52) U.S. Cl. .................. 257/215; 257/E31.075; 438/75
(58) Field of Classification Search .................. 257/214, 257/215, 226, 222, 225, 240, 291, E31.075; 438/75
See application file for complete search history.

(56) References Cited

U.S. PATENT DOCUMENTS

| | | | |
|---|---|---|---|
| 3,683,193 A | | 8/1972 | Weimer ...................... 250/208.1 |
| 4,242,700 A | | 12/1980 | Weimer ........................ 348/275 |
| 4,583,122 A | * | 4/1986 | Ohwada et al. ................ 348/792 |
| 4,686,554 A | * | 8/1987 | Ohmi et al. .................... 257/443 |
| 4,829,343 A | * | 5/1989 | Levi ................................. 257/26 |
| 5,043,785 A | * | 8/1991 | Mizutani et al. ............... 257/443 |
| 5,227,886 A | * | 7/1993 | Efron et al. ....................... 348/62 |
| 5,403,772 A | | 4/1995 | Zhang et al. |
| 5,481,121 A | * | 1/1996 | Zhang et al. ..................... 257/64 |
| 5,501,989 A | | 3/1996 | Takayama et al. |
| 5,529,937 A | | 6/1996 | Zhang et al. |
| 5,537,000 A | * | 7/1996 | Alivisatos et al. ............. 313/506 |
| 5,569,936 A | * | 10/1996 | Zhang et al. .................... 257/57 |
| 5,582,640 A | * | 12/1996 | Okada et al. ...................... 117/8 |
| 5,589,694 A | | 12/1996 | Takayama et al. |
| 5,604,364 A | * | 2/1997 | Ohmi et al. .................... 257/291 |
| 5,650,644 A | * | 7/1997 | Funakoshi et al. ............ 257/240 |
| 5,705,829 A | | 1/1998 | Miyanaga et al. |
| 5,744,822 A | | 4/1998 | Takayama et al. |
| 5,824,235 A | * | 10/1998 | Yamazaki et al. ............... 216/23 |
| 5,873,003 A | * | 2/1999 | Inoue et al. ...................... 396/51 |
| 5,882,960 A | | 3/1999 | Zhang et al. |
| 5,895,933 A | | 4/1999 | Zhang et al. |
| 6,071,764 A | | 6/2000 | Zhang et al. |
| 6,077,758 A | | 6/2000 | Zhang et al. |
| 6,455,401 B1 | | 9/2002 | Zhang et al. |
| 6,624,445 B2 | | 9/2003 | Miyanaga et al. |
| 6,730,549 B1 | | 5/2004 | Zhang et al. |
| 6,756,657 B1 | | 6/2004 | Zhang et al. |
| 2003/0022467 A1 | | 1/2003 | Zang et al. |

FOREIGN PATENT DOCUMENTS

| | | |
|---|---|---|
| EP | 0 605 246 | 7/1994 |
| EP | 0 631 325 | 12/1994 |

(Continued)

OTHER PUBLICATIONS

Schoenfeld et al., Crystallization of amorphous silicon by NiSi sbu 2 precipitates, Thin Solid Films, pp. 236-240, Jun. 1995.*

*Primary Examiner* — W. David Coleman
(74) *Attorney, Agent, or Firm* — Fish & Richardson P.C.

(57) ABSTRACT

A charge coupled device is manufactured by using a crystalline silicon film that is formed by growing a crystal in parallel with a substrate by utilizing the nickel element with an amorphous silicon film used as a starting film. The crystal growth direction is made coincident with the charge transfer direction. As a result, the charge coupled device is given high charge transfer efficiency.

21 Claims, 10 Drawing Sheets

FOREIGN PATENT DOCUMENTS

| | | |
|---|---|---|
| JP | 58-023478 | 2/1983 |
| JP | 05-152551 | 6/1993 |
| JP | 07-064114 | 3/1995 |
| JP | 07-094757 | 4/1995 |
| JP | 07-183535 | 7/1995 |
| JP | 07-321339 | 12/1995 |

* cited by examiner

CHARGE TRANSFER SEMICONDUCTOR DEVICE AND MANUFACTURING METHOD THEREOF

BACKGROUND OF THE INVENTION

1. Field of the Invention

The present invention relates to the structure of a charge coupled device (CCD).

2. Description of the Related Art

The semiconductor device called "charge coupled device (CCD)" is known which has a function that in an array of a number of potential wells formed in a semiconductor, charges accumulated in the potential wells are sequentially transferred from each potential well to the adjacent one.

By using this device, for example, it is possible to form a spatial charge distribution corresponding to a spatial distribution (one-dimensional) of incident light intensity by an array-like photoelectric conversion elements, and then convert it into an output time-series signal (i.e., an electrical signal that varies over time) by repeating charge transfer in a CCD shift register.

The CCD can be used for an image sensor, a delay line, a filter, a memory, an operation unit, etc.

FIG. 1 shows a basic structure of a CCD. In FIG. 1, reference numeral 8 denotes a p-type single crystal silicon substrate. An insulating film 7 such as a silicon oxide film is formed on the surface of the p-type single crystal silicon substrate 8. Electrodes 1-6 are disposed on the insulating film 7 at predetermined intervals, whereby a number of MOS capacitors are arranged. The interval of the electrodes 1-6 is determined so as to satisfy a requirement that the adjacent MOS capacitors be charge-coupled.

Three-phase lines Ø1-Ø3 are connected to the electrodes 1-6. In the state shown in FIG. 1, a predetermined voltage is applied from the line Ø1 to the electrodes 1 and 4, whereby potential wells 9 and 10 are formed at the corresponding MOS capacitor portions. In this state, a certain amount of charge is accumulated in each of potential wells 9 and 10.

If the voltage application line is changed from the line Ø1 to the line Ø2, the potential wells that existed under the electrodes 1 and 4 disappear and potential wells are newly formed under the electrodes 2 and 5. At this time, the charges that were accumulated in the potential wells under the electrodes 1 and 4 move to the potential wells under the electrodes 2 and 5. In this manner, charges are transferred from each potential well to the adjacent one.

By properly controlling signal voltages applied to the lines Ø1-Ø3, the charge transfer is effected sequentially according to the above principle and an electrical signal is finally output to the outside of the CCD. A resulting output reflects a one-dimensional spatial distribution of charges accumulated in the MOS capacitor array.

The CCD as shown in FIG. 1 is manufactured by using a single crystal silicon wafer. As is well known, the single crystal silicon wafer is limited in shape and size.

Further, in the structure using a silicon wafer, the operation speed is limited due to occurrence of capacitance via the substrate. Although the SOI structure is known as a structure for improving this problem, it has other problems of a high cost and a difficulty in providing a large-area device.

In recent years, it is desired that devices and circuits each having a single function, such as a CCD, memory, and an amplifier, be integrated in one chip. This is necessary to satisfy increasingly strong requirements such as miniaturization, reduction in power supply voltage, reduction in power consumption, multi-functionalization, and reduction in cost.

However, if it is intended to use a conventional IC process to integrate the above-mentioned devices and circuits having different functions in one chip, there remain the above-mentioned problems of the limited substrate area and the existence of capacitance via the substrate.

SUMMARY OF THE INVENTION

An object of the present invention is to provide a structure which can solve the problems of the limited substrate area and the existence of capacitance via the substrate in a conventional CCD that uses a silicon wafer.

Another object of the invention is to provide a technique for integrating, on the same substrate, a CCD and other devices and circuits having different functions.

According to one aspect of the invention, there is provided a charge transfer semiconductor device comprising charge accumulating means in which a plurality of photodetecting elements are arranged, for accumulating charges in accordance with incident light; charge transfer means for transferring the charges accumulated in the charge accumulating means; and a crystalline silicon film having rod-like or columnar crystal bodies extending in a particular direction that coincides or approximately coincides with a charge transfer direction of the charge transfer means.

This configuration utilizes the anisotropic crystal structure having a characteristic direction (indicated by reference numeral 27 in FIG. 3C) that is parallel with the substrate.

If the crystal growth is effected in the direction indicated by numeral 27, rod-like or columnar crystal bodies extending in a particular direction are obtained as exemplified by FIGS. 5 and 6. By forming a charge coupled device (see FIG. 2) so that the charge transfer direction coincides with the above-mentioned particular direction, the charge transfer efficiency can be increased.

In the above crystal structure, grain boundaries extend in the direction in which the rod-like or columnar crystal bodies extend. The grain boundaries restrict the movement direction of moving carriers. The crystal structure is continuous in the direction in which the crystal bodies extend, and this direction can be regarded as single crystal for moving carriers. Therefore, making the charge transfer direction coincide with the crystal bodies extending direction (i.e., grain boundaries extending direction), a charge coupled device having high transfer efficiency can be obtained.

According to another aspect of the invention, there is provided a charge transfer semiconductor device comprising a crystalline silicon film having rod-like or columnar crystal bodies extending in a particular direction; and a charge coupled device disposed so that a charge transfer direction coincides or approximately coincides with the particular direction.

Also with this configuration, a charge coupled device having high transfer efficiency can be obtained by setting the charge transfer direction so that it coincides with the direction in which the rod-like or columnar crystal bodies extend.

According to a further aspect of the invention, there is provided a manufacturing method of a charge transfer semiconductor device using a crystalline silicon film having rod-like or columnar crystal bodies extending in a particular direction, comprising the steps of forming an amorphous silicon film on a substrate having an insulating substrate; introducing a metal element for accelerating crystallization of silicon into a predetermined region of the amorphous silicon film; performing a heat treatment to cause crystal growth parallel with the substrate starting from the predetermined portion, to thereby obtain a silicon film; performing a heat treatment in an oxidizing atmosphere containing a halogen element, to form a thermal oxidation film on a surface of the silicon film; removing the thermal oxidation film; and forming a charge coupled device having a function of transferring charge in a direction that coincides or approximately coincides with the particular direction.

In this manufacturing method, the metal element may be one or a plurality of elements selected from the group consisting of Fe, Co, Ni, Ru, Rh, Pd, Os, Ir, Pt, Cu, and Au. In particular, Ni (nickel) is superior in terms of reproducibility and effect.

To obtain the crystal structure as shown in FIGS. 5 and 6 formed by causing crystal growth in the particular direction, the following steps are needed:

(1) causing crystal growth in a particular direction by partially introducing a metal element;

(2) forming a thermal oxidation film by performing a heat treatment in an oxidizing atmosphere containing a halogen element (the crystallinity is improved and the metal element is removed by forming the thermal oxidation film); and (3) removing the thermal oxidation film that contains the metal element at a relatively high concentration.

By performing at least the above steps, the crystal structure as shown in FIGS. 5 and 6 can be obtained in which carriers can move easily in the particular direction.

In step (2) for forming the thermal oxidation film, it is important that the heating temperature be set at 800°-1,100° C., preferably 900°-1,100° C. If the heating temperature is lower than 800° C., a film will contain a number of defects to prevent provision of the desired electrical characteristics. In other words, a resulting silicon film will have no particular difference from an ordinary silicon film.

DETAILED DESCRIPTION OF THE PREFERRED EMBODIMENTS

Embodiment 1

Device Structure

Figure 1:
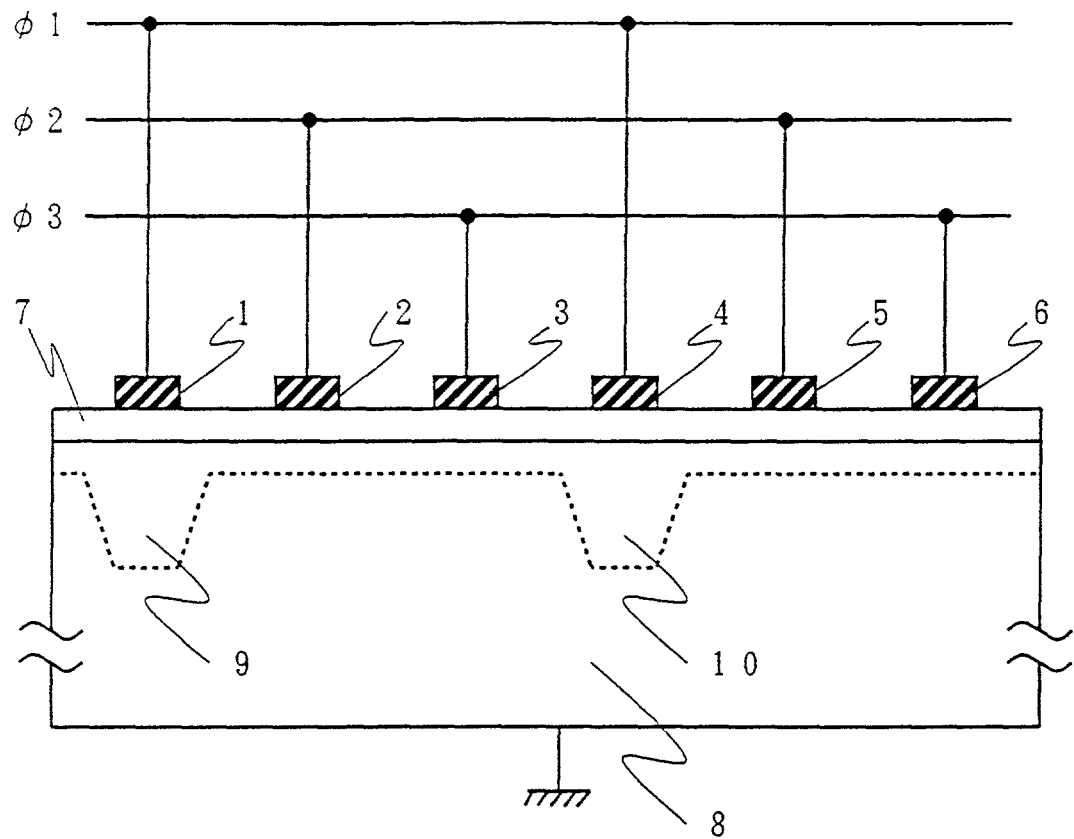
FIG. 1 shows a conventional structure of a CCD.
Figure 2:
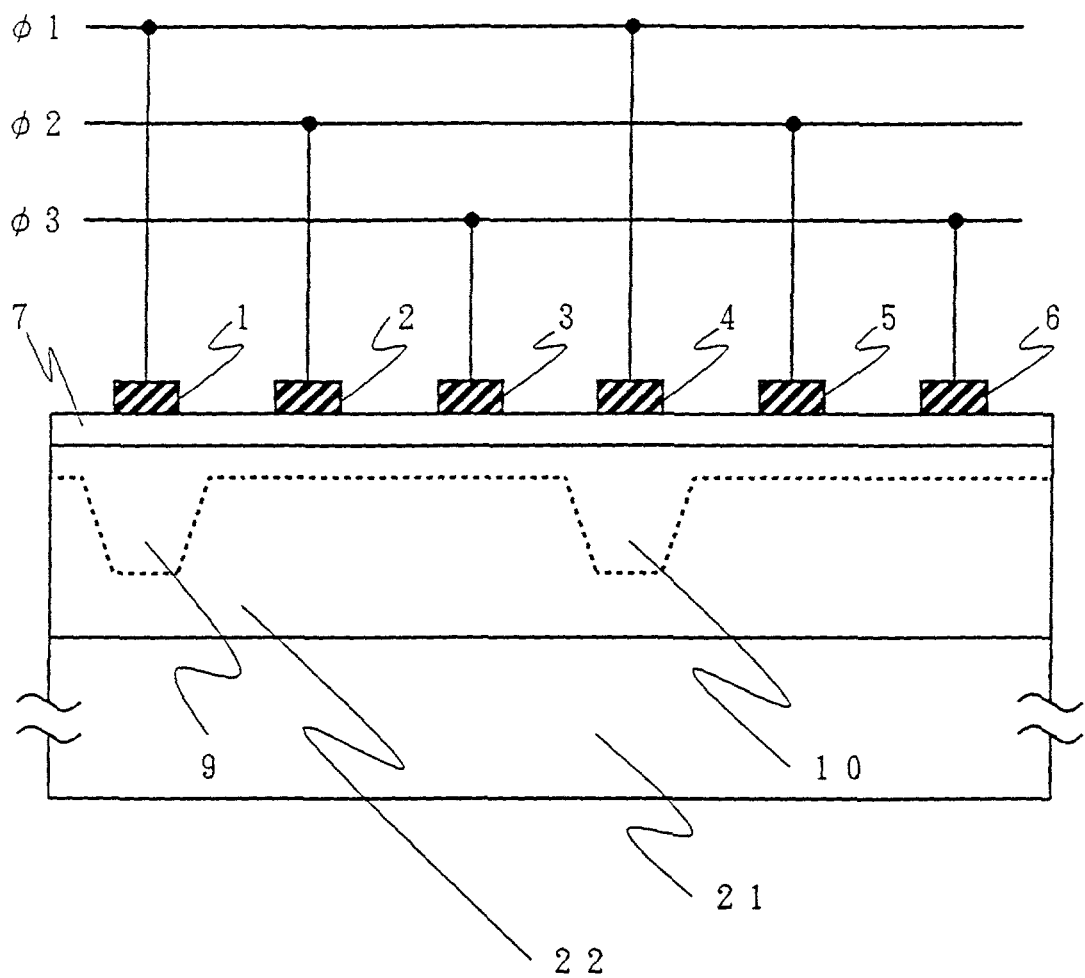
FIG. 2 shows a general structure of a CCD according to Embodiment 1.

FIG. 2 shows the structure of a CCD according to this embodiment from the viewpoint of its principle of operation. The structure of FIG. 2 is different from that of FIG. 1 in that a quartz substrate 21 is used and a crystalline silicon film 22 that is formed on the quartz substrate 21 is used as a semiconductor that constitutes the active layer of the CCD.

The parts in FIG. 2 having corresponding parts in FIG. 1 are given the same reference numerals as the latter. The principle of operation of the CCD of FIG. 2 is also the same as that of the CCD of FIG. 1.

Figure 5:
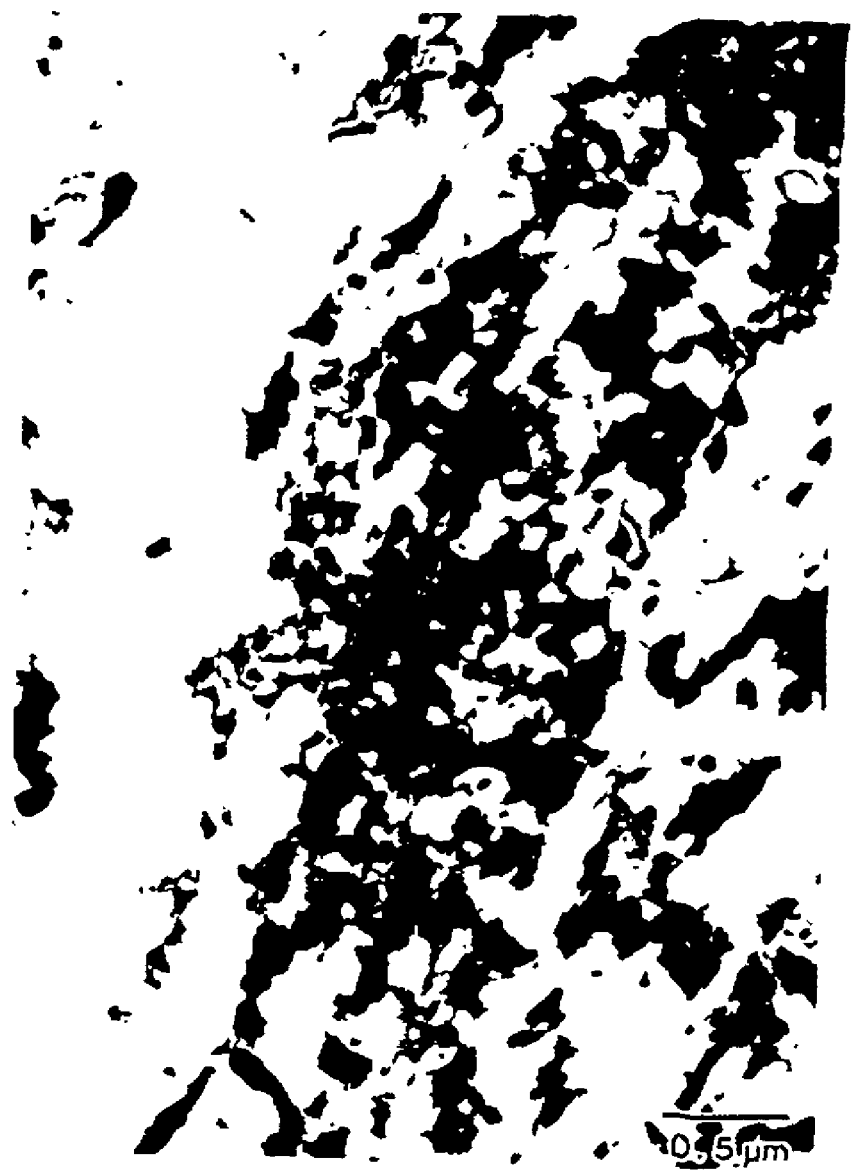
FIGS. 5 and 6 are transmission electron microscope photographs showing crystal states of crystalline silicon films.
Figure 6:

This embodiment has a feature that the crystalline silicon film 22 is one that has grown in rod-like or columnar form in the charge transfer direction. FIGS. 5 and 6 are TEM (transmission electron microscope) photographs of crystalline silicon films having such a unique structure.

The crystalline silicon films shown in FIGS. 5 and 6 are ones that were obtained by a method described later. As seen from FIGS. 5 and 6, the continuity of the crystal structure is held approximately in a particular direction (i.e., a direction in which rod-like or columnar structures extend).

For carriers, the crystal structure can be regarded as a single crystal structure in the direction in which the continuity of the crystal structure is held. Therefore, carriers moving in the direction in which the crystal structure is continuous are not restricted by grain boundaries. Further, since grain boundaries extend in the direction in which the crystal structure is continuous, the potential barriers of the grain boundaries forces, to a certain extent, carriers to move in the forward direction.

In the structure of the embodiment, potential wells 9 and 10 are arranged in the direction in which the crystal structure is continuous. That is, the arrangement direction of the array of electrodes 1-6 is taken in the direction in which the crystal structure is continuous. As a result, the charge transfer efficiency can be increased, making it possible to provide high-performance CCD.

[Manufacturing Method of Crystalline Silicon Film]

FIGS. 3A-3C and 4A-4C show a manufacturing process of the crystalline silicon film 22 having the unique crystal structure as shown in FIGS. 5 and 6.

First, a quartz substrate 21 is prepared and its surface is cleaned. It is necessary that the surface of the quartz substrate be sufficiently smooth.

Figure 3A:
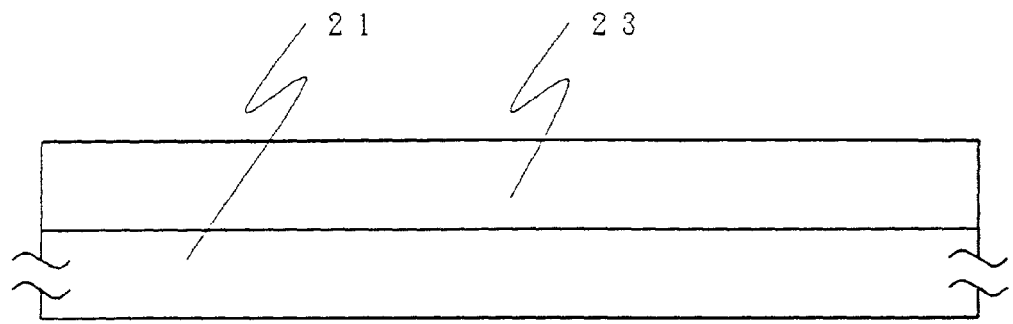
FIGS. 3A-3C and 4A-4C show a manufacturing process of a crystalline silicon film according to Embodiment 1.

A 500-Å-thick amorphous silicon film 23 is then formed on the quartz substrate 21 by low pressure CVD (see FIG. 3A).

A mask 24 is then formed by forming a 700-Å-thick silicon oxide film by plasma CVD and patterning it. The mask 24 has an opening 26 where the amorphous silicon film 23 is exposed (see FIG. 3B).

After the formation of the mask 24, a nickel acetate salt solution whose density is adjusted to 10 ppm (in terms of weight) is applied with a spinner. In this state, a nickel element 25 is held in contact with the exposed surface (see FIG. 3B).

Figure 3B:
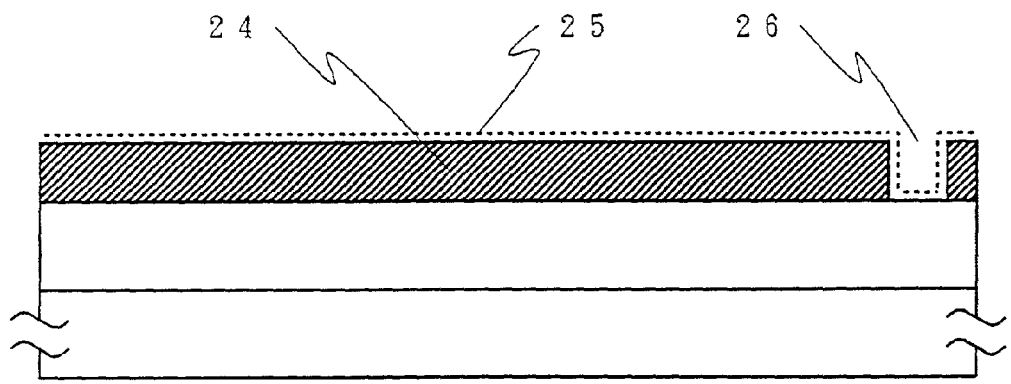

After the state of FIG. 3B is obtained, a heat treatment is performed at 600° C. for 8 hours in a nitrogen atmosphere. In this step, a crystal grows in an arrowed direction 27 that is parallel with the substrate (see FIG. 3C).

This crystal growth starts from the point under the opening 26 where the nickel element is held in contact with the surface of the amorphous silicon film 23. The crystal growth direction 27 at least approximately coincides with the particular direction as shown in FIGS. 5 and 6 in which the crystal structure is continuous.

In this state, the crystal structure as shown in FIGS. 5 and 6 is not completely obtained yet. In this state, rod-like or columnar crystal structural bodies as shown in FIGS. 5 and 6 that extend in the particular direction contain many defects. Further, the unique crystal structure as shown in FIGS. 5 and 6 does not appear clearly yet.

Figure 3C:
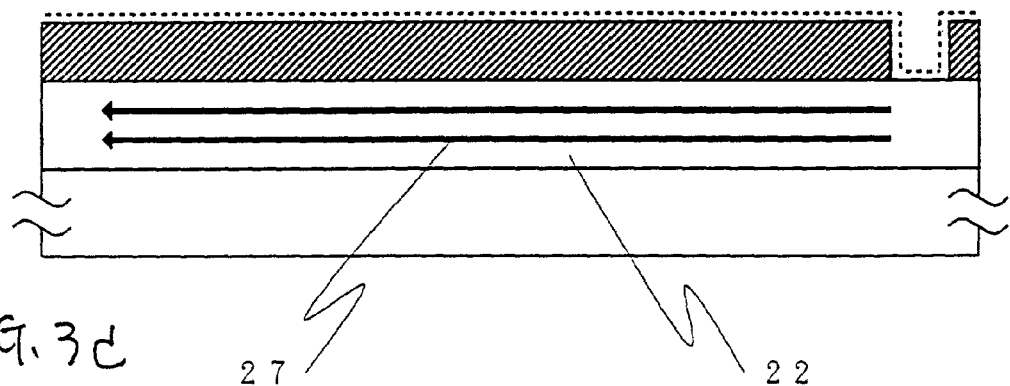
Figure 4A:
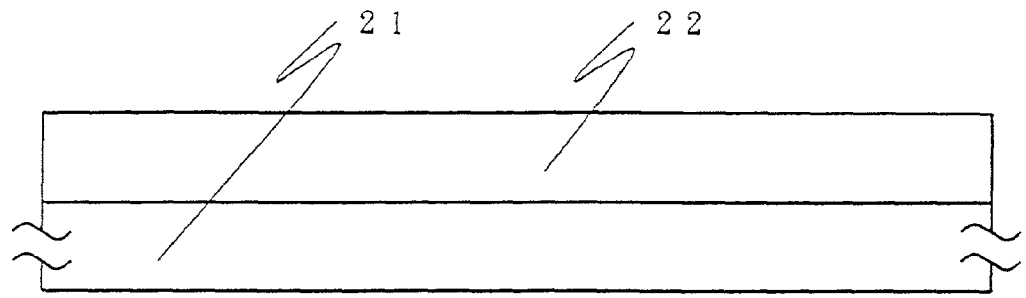

After the completion of the crystal growth step of FIG. 3C, the silicon oxide film mask 24 is removed to obtain the state of FIG. 4A.

In this state, a 200-Å-thick thermal oxidation film 28 is grown by performing a heat treatment at 950° C. for 20 minutes in an oxygen atmosphere containing HCl at 3 volume percent. This step is important in which the crystallinity of the crystalline silicon film 22 is improved (conversion into the crystal structure as shown in FIGS. 5 and 6). At the same time, the nickel element is removed from the crystalline silicon film 22.

The nickel element is removed such that it is captured into the thermal oxidation film 28 and vaporized into the atmosphere. It is considered that chlorine plays an important role in the nickel element removal.

Figure 4B:
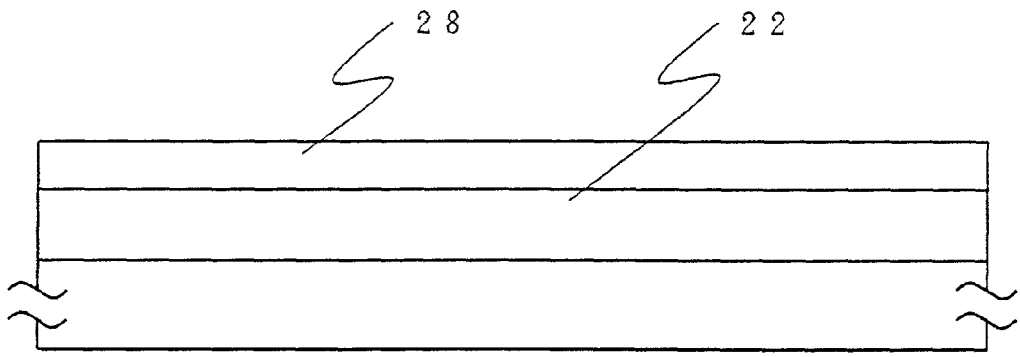
Figure 4C:
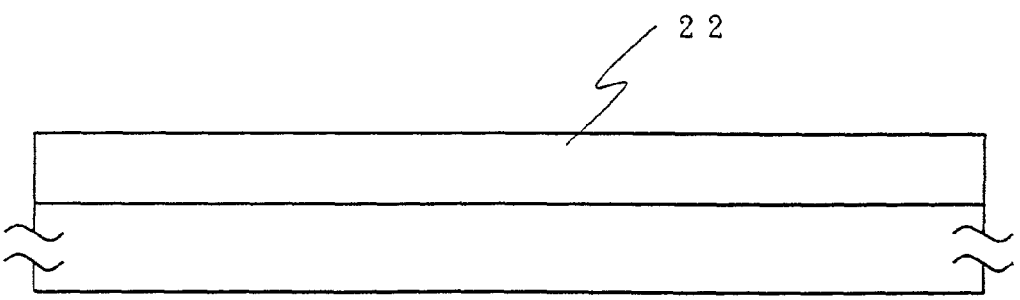

The thermal oxidation film 28 thus formed is then removed (see FIG. 4C). By removing the thermal oxidation film 28 that contains the nickel element at a relatively high concentration, adverse effects that would otherwise be caused by the existent of the nickel element can be eliminated in a device that will be finally obtained.

In general, the existence of heavy metal elements in an unstable state in a semiconductor device (particularly in an active layer or a region adjacent thereto) is not preferable because they impair the operation of the semiconductor device. In this sense, the removal of the nickel element by using the above-described technique is very effective.

By removing the thermal oxidation film 28 that was formed in the step of FIG. 4B, a crystalline silicon film having the unique crystal structure as shown in FIGS. 5 and 6 can be obtained.

Thereafter, a thermal oxidation film (not shown) is formed again. An insulating film of MOS capacitors to serve as the insulating film 7 of FIG. 2 is formed by using this thermal oxidation film.

Electrodes are then formed in a predetermined pattern, to complete a CCD element. At this time, it is important that the charge transfer direction be made coincident with the above-described crystal growth direction.

Embodiment 2

This embodiment is directed to an interline transfer (II) two-dimensional CCD image sensor.

Figure 7:
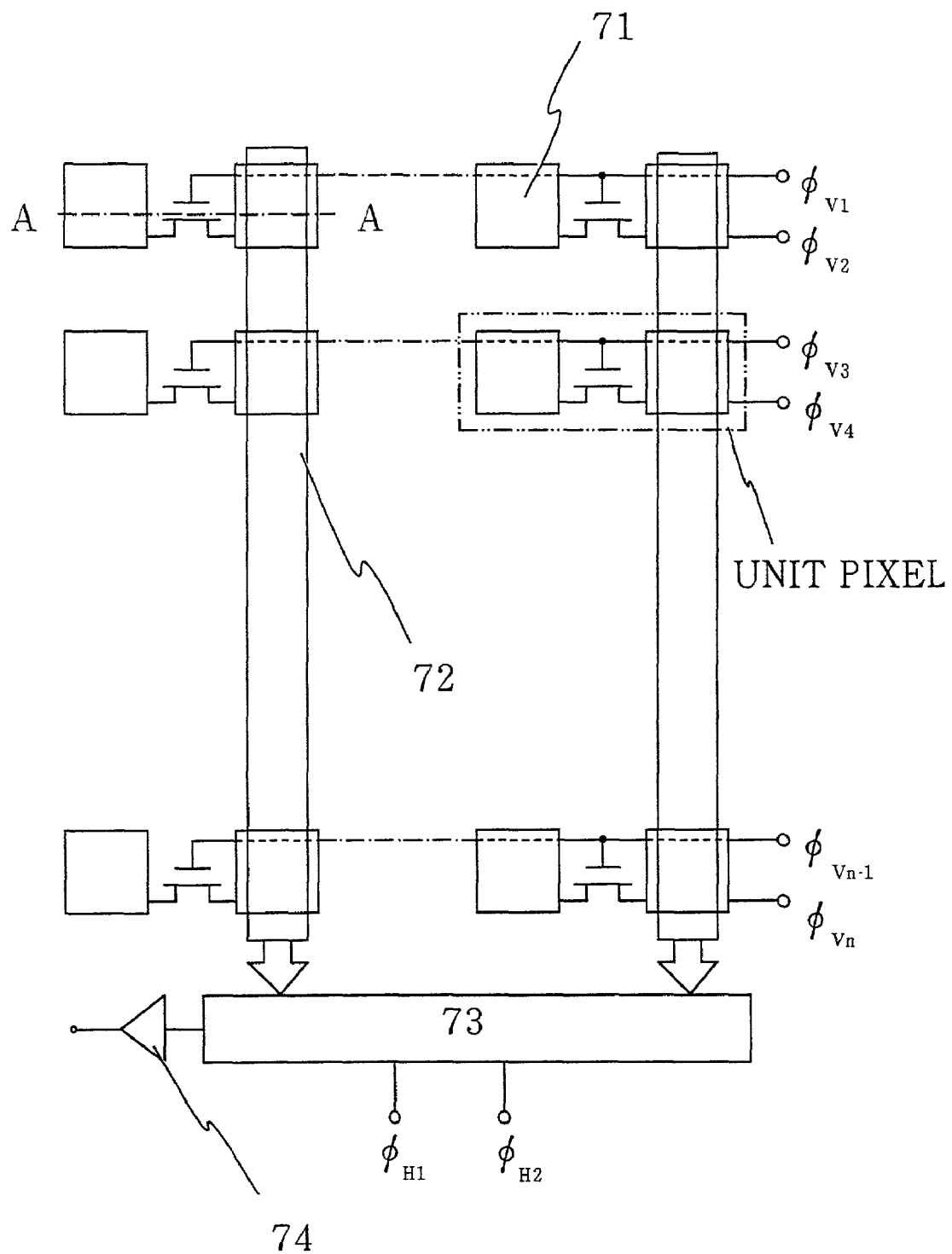
FIG. 7 shows a configuration of a two-dimensional CCD image sensor according to Embodiment 2.
Figure 8:
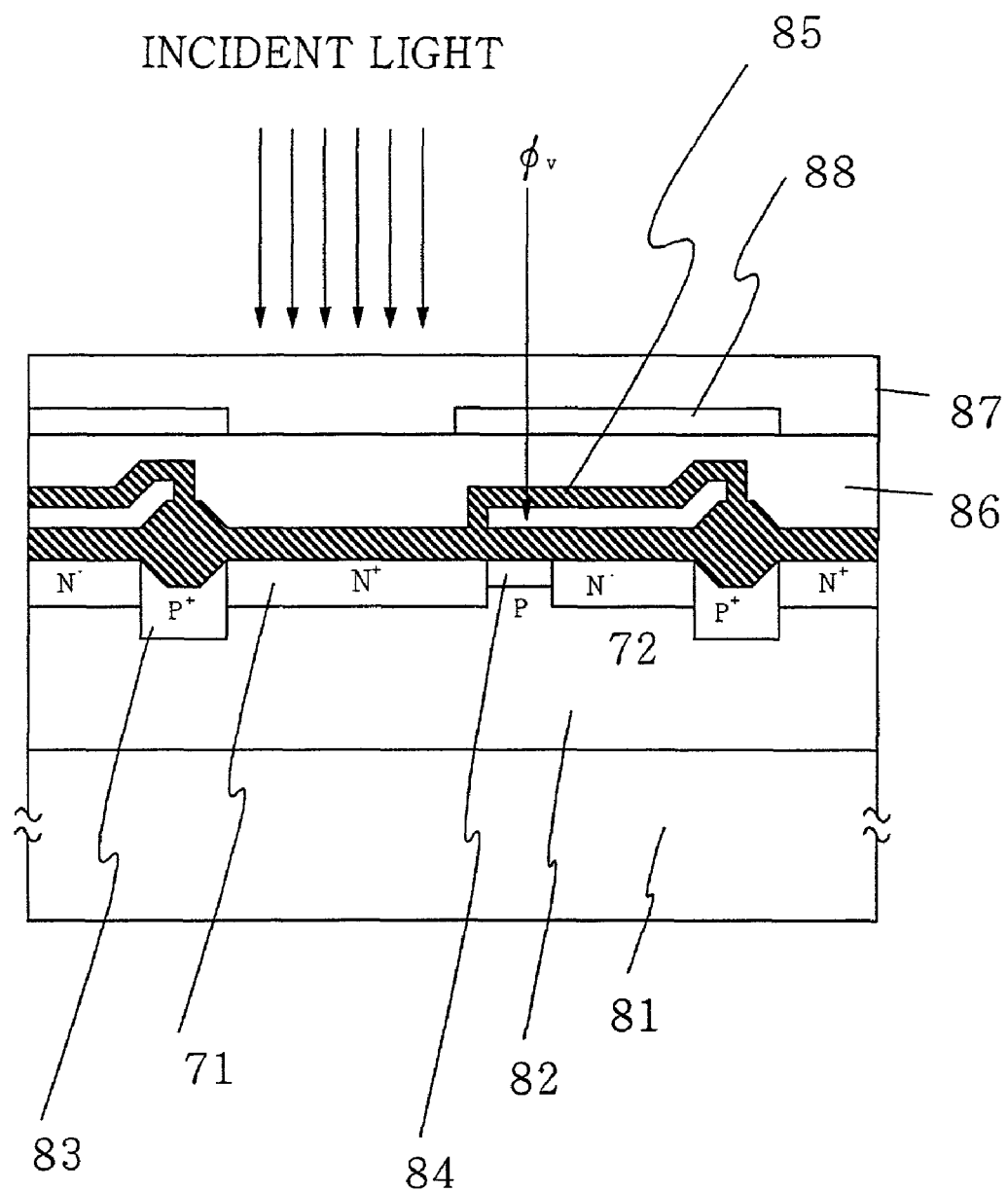
FIG. 8 is a sectional view of a one-pixel portion of the two-dimensional CCD image sensor of FIG. 7.

FIG. 7 shows a block diagram, as viewed from above, of a two-dimensional CCD image sensor. FIG. 8 is a sectional view taken along line A-A' in FIG. 7 and shows a general structure.

The device of FIG. 7 has functions of generating signal charges with photodiodes 71 when illuminated with light, transferring charges accumulated therein with CCDs, and outputting the charges as a time-series signal.

In this embodiment, a case is considered in which the device is illuminated with light having a certain spatial intensity distribution (for instance, light having strong and weak portions that are distributed two-dimensionally corresponding to a certain image).

In this case, each group (column) of photodiodes 71 that are arranged vertically provides charge accumulation states having a one-dimensional spatial distribution of the column. The charge accumulation states obtained by each group (column) of photodiodes 71 that are vertically arranged are sequentially transferred to a horizontal CCD 73 by the corresponding vertical CCD 72.

By properly setting the transfer timing of the vertical CCD 72 and that of the horizontal CCD 73, the signal charges accumulated by the photodiode arrays of the respective columns can be sequentially transferred to the horizontal CCD 73 and read out by a charge detector 74.

That is, the signal charges having a two-dimensional distribution that are accumulated in the respective photodiodes 71 that are arranged in two-dimensional matrix form can be output from the charge detector 74 as a time-series signal.

FIG. 8 is a general sectional view of a unit pixel portion taken along line A-A' in FIG. 7. In this embodiment, the photodiode 71 and the vertical CCD (VCCD) 72 are formed on a quartz substrate 81 by using a crystalline silicon film 82 that is manufactured by the method as described in Embodiment 1.

A signal charge corresponding to the intensity or quantity of incident light is generated in the photodiode 71, and then captured by a field shift gate 84 into an n-region that constitutes the vertical CCD 72. The signal charge is then transferred by the vertical CCD 72 to the horizontal CCD 73 (see FIG. 7) in accordance with a voltage that is supplied from a line $\varnothing_v$.

In FIG. 8, reference numeral 85 denotes a silicon oxide film and numerals 86 and 87 denote interlayer insulating films. Further, a light shield 88 for shielding the vertical CCD 72 from incident light is formed.

In this embodiment, the crystal growth direction is made coincident with each of the charge transfer directions of the vertical CCDs 72 and the horizontal CCD 73, whereby the charge transfer efficiency can be increased.

The configuration of this embodiment is advantageous in that necessary devices and circuits can be formed on the quartz substrate. For example, the charge detector 74 (see FIG. 7) can be integrated with the other components on the same quartz substrate 81.

Further, although not shown in FIG. 7, circuits for processing, correcting, or storing image information can also be integrated with the other components by using the crystalline silicon film that is used for forming the CCDs.

The two-dimensional CCD image sensor of this embodiment employs the quartz substrate. Therefore, a modified configuration is possible in which light incidence is made from the substrate side.

Embodiment 3

This embodiment relates a configuration in which an active matrix circuit of an active matrix liquid crystal device and a CCD line sensor are integrated.

Figure 9:
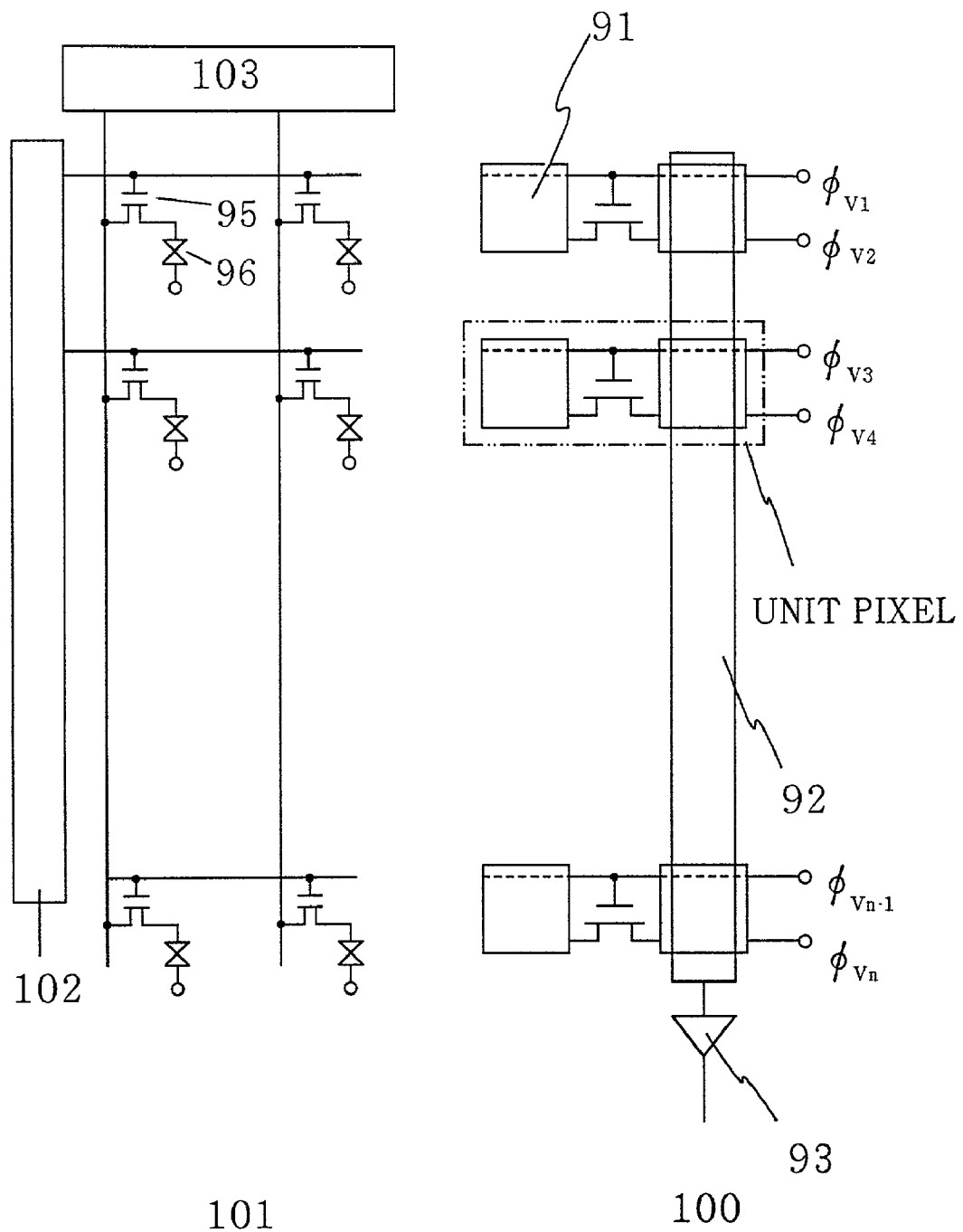
FIG. 9 shows a configuration in which a CCD image sensor and an active matrix circuit are integrated according to Embodiment 3.

FIG. 9 shows a general configuration of this embodiment in which a one-dimensional CCD line image sensor 100 and an active matrix circuit 101 are integrated on the same quartz substrate. The one-dimensional CCD image sensor 100 is configured in the same manner as one-line portion of the two-dimensional CCD image sensor of the second embodiment. Pixels each including two photodiodes 91 are arranged one-dimensionally. A vertical CCD 92 is formed that transfers charges detected by the photodiodes 91. The charges transferred by the vertical CCD 92 are detected by a charge detector 93. In the active matrix circuit 101, a thin-film transistor 95 and a liquid crystal cell 96 are formed for each pixel.

In the configuration of this embodiment, a horizontal scanning shift register 102, a vertical scanning shift register 103, the thin-film transistors 95 that are arranged in the active matrix circuit 101, and the CCD image sensor 100 are formed by using a crystalline silicon film of the kind as described in Embodiment 1.

In the thin-film transistors 95, the crystal growth direction of the crystalline silicon film is made coincident (or approximately coincident) with the carrier movement direction during operation. In the CCD image sensor 100, the crystal growth direction is made coincident (or approximately coincident) with the charge transfer direction.

With the above configuration, the operation speed can be improved in the thin-film transistors 95 and the charge transfer efficiency can be improved in the CCD image sensor 100.

The configuration of this embodiment can be utilized in integrating an image information display function and an image information capturing function in a portable information processing terminal.

Figure 10:
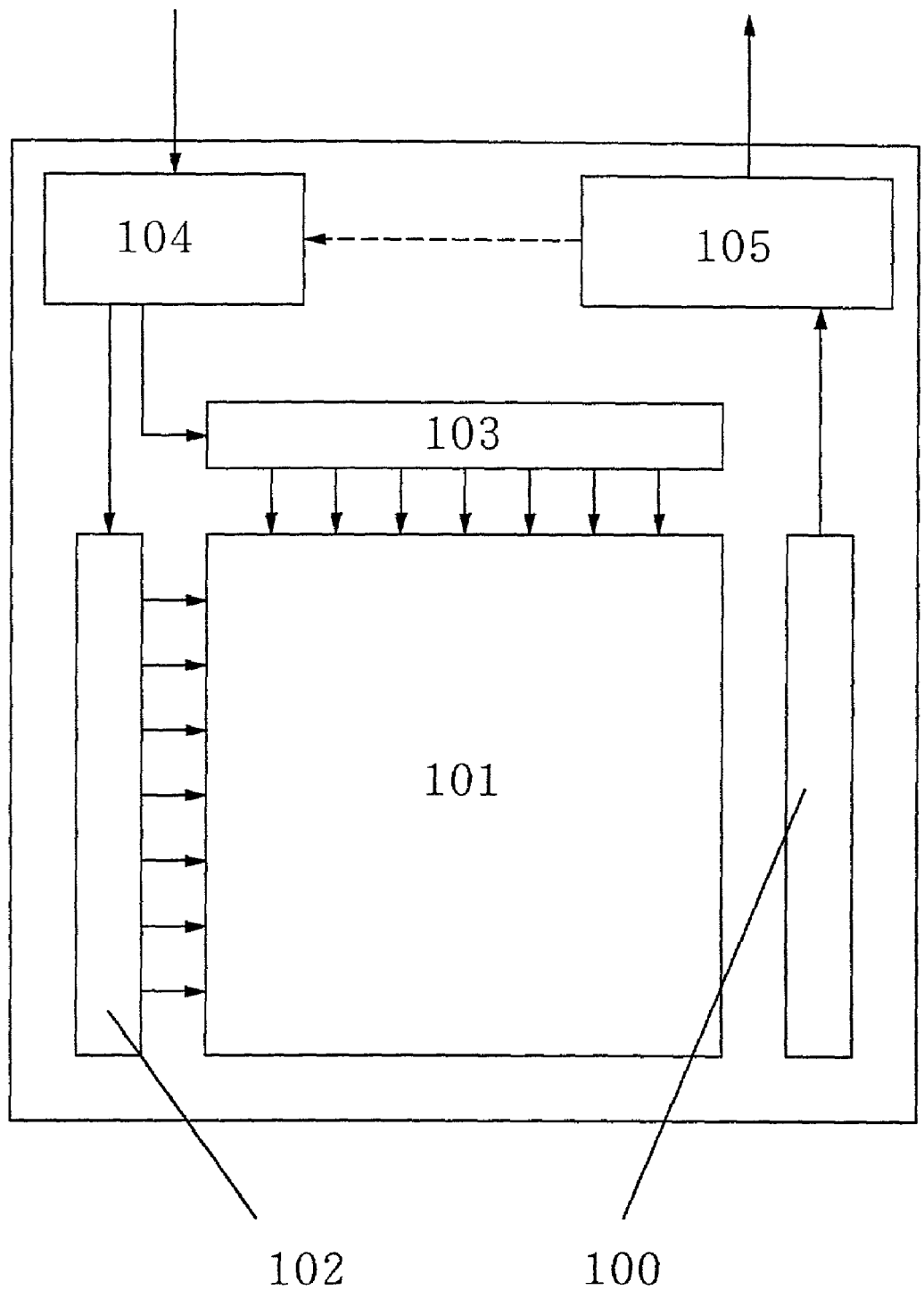
FIG. 10 shows a configuration of a substrate of an active matrix liquid crystal display device according to Embodiment 3.

FIG. 10 shows a general configuration of a substrate (on the circuits arrangement side) of an active matrix liquid crystal display device to which this embodiment is applied.

The configuration of FIG. 10 has functions of supplying signals from an image signal generation device 104 to a horizontal scanning shift register 103 and a vertical scanning shift register 102, and driving an active matrix circuit 101 with the shift registers 102 and 103, thereby displaying an image.

The respective circuits of the image signal generation device 104, the horizontal scanning shift register 103, the vertical scanning shift register 102, and the active matrix circuit 101 are constituted of thin-film transistors that use a crystalline silicon film that is formed on a quartz substrate by the method of Embodiment 1.

In the configuration of FIG. 10, a CCD line image sensor 100 is integrated with the above circuits on the same quartz substrate by using thin-film transistors.

Pieces of image information taken from the CCD image sensor 100 are combined with each other by an image signal combining device 105, and a combined image-related signal is stored in a storage device that is outside the liquid crystal panel or sent to an external system from an interface circuit.

If an image-related signal that is composed by the image signal combining device 105 is supplied to the image signal generation device 104, an image that has been read by the CCD image sensor 100 can be viewed by displaying it with the active matrix circuit 101.

As described above, according to the invention, since an insulating substrate as typified by a quartz substrate can be used, a large-area CCD array can be formed.

In contrast to the case of using a silicon substrate, the influences of capacitance via the substrate can be lowered, which is advantageous in realizing a high-speed operation.

In particular, the charge transfer utilizing the unique crystal structure is effective in improving the charge transfer efficiency.

What is claimed is:

1. A semiconductor device comprising:
   a plurality of photodiodes being formed in a matrix on an insulating surface;
   a plurality of vertical charge coupled devices on the insulating surface, said vertical charge coupled devices being connected with the plurality of photodiodes;
   at least a horizontal charge coupled device on the insulating surface, said horizontal charge coupled device being connected with the vertical charge coupled devices,
   wherein at least one of the vertical and horizontal charge coupled devices comprises a crystalline semiconductor film having a plurality of crystals extending in a crystal growth direction,
   wherein a crystal structure of the crystalline semiconductor film in the crystal growth direction is continuous so that a charge moving is not restricted by a grain boundary,
   wherein at least one of the vertical and horizontal charge coupled devices that has the crystalline semiconductor film is arranged such that a charge transfer direction of the at least one of the vertical and horizontal charge coupled devices is coincident with the crystal growth direction.

2. A device according to claim 1 further comprising an active matrix display device being integrated with said vertical and horizontal charge coupled devices over a same substrate.

3. A device according to claim 1,
   wherein the crystalline semiconductor film is formed over a quartz substrate, and
   wherein an incident light is made from a side of the quartz substrate.

4. A device according to claim 1 wherein said charge transfer direction includes a plurality of directions.

5. A device according to claim 1 wherein said semiconductor film is a silicon film.

6. A method of manufacturing a charge transfer semiconductor device, said method comprising the steps of:
   forming an amorphous semiconductor film on an insulating surface;
   selectively introducing a metal element for promoting crystallization of said semiconductor in contact with a portion of said amorphous semiconductor film;
   heating the amorphous semiconductor film so that a plurality of crystals grow in a crystal growth direction parallel with said insulating surface from the portion to form a crystalline semiconductor film;
   heating said crystalline semiconductor film in an oxidizing atmosphere including a halogen element to form a thermal oxidation film on a surface of the semiconductor film;
   removing said thermal oxidation film; and
   forming at least a charge coupled device for transferring a charge in a charge transfer direction that coincides with the crystal growth direction.

7. A method according to claim 6 wherein said insulating surface is a quartz substrate.

8. A method according to claim 6 wherein said metal element is at least one element selected from the group consisting of Fe, Co, Ni, Ru, Rh, Pd, Os, Ir, Pt, Cu, and Au.

9. A method according to claim 6 wherein said crystalline semiconductor film is heated in the oxidizing atmosphere at 800-1100° C.

10. A method according to claim 6 wherein said semiconductor film is a silicon film.

11. A semiconductor device including a CCD, said CCD comprising:
    a crystalline semiconductor film formed on an insulating surface, said crystalline semiconductor film having a plurality of crystals extending in a crystal growth direction which is parallel to the insulating surface;
    an insulating film on the crystalline semiconductor film;
    a plurality of electrodes formed on the insulating film, each of said plurality of electrodes located within a predetermined distance so that a plurality of MOS capacitors are formed between the plurality of electrodes and the crystalline semiconductor film with the insulating film therebetween,
    wherein a charge is transferred from one of the MOS capacitors to another of the MOS capacitors in a charge transfer direction,
    wherein a crystal structure of the crystalline semiconductor film is continuous su that the crystal structure is regarded as single crystal for the charge,
    wherein the charge transfer direction is coincident with said crystal growth direction.

12. A device according to claim 11, wherein said insulating surface is a quartz substrate.

13. A device according to claim 11, wherein said semiconductor device is at least one selected from the group consisting of an image sensor, a delay line, a filter; a memory and an operation unit.

14. A semiconductor device comprising:
a photoelectric conversion being formed over an insulating surface;
a charge coupled device being electrically connected to the photoelectric conversion device and formed over the insulating surface;
said charge coupled device including:
a crystalline semiconductor film being formed on the insulating surface, said crystalline semiconductor film having a plurality of crystals extending in a crystal growth direction which is parallel to the insulating surface;
an insulating film on the crystalline semiconductor film;
a plurality of electrodes being formed on the insulating film, each of said plurality of electrodes being located within a predetermined distance so that a plurality of MOS capacitors are formed between the plurality of electrodes and the crystalline semiconductor film with the insulating film therebetween,
wherein a charge is transferred from one of the MOS capacitors to another of the MOS capacitors in a charge transfer direction,
wherein a crystal structure of the crystalline semiconductor film in the crystal growth direction is continuous so that a charge moving is not restricted by a grain boundary,
wherein the charge transfer direction is coincident with the crystal growth direction.

15. A device according to claim 14, wherein said insulating surface is a quartz substrate.

16. A device according to claim 14, wherein said semiconductor device is an image sensor.

17. A device according to claim 14, wherein said photoelectric conversion device is a photodiode.

18. A device according to claim 14 further comprising an active matrix type liquid crystal display device being integrated over the insulating surface.

19. A semiconductor device comprising:
a plurality of photodiodes formed in a matrix on an insulating surface;
a plurality of vertical charge coupled devices on the insulating surface, said vertical charge coupled devices connected with the plurality of photodiodes;
at least a horizontal charge coupled device on the insulating surface, said horizontal charge coupled device connected with the vertical charge coupled device,
wherein at least one of the vertical and horizontal charge coupled devices comprises a crystalline semiconductor film having a plurality of crystals extending in a crystal growth direction,
wherein a charge transfer direction of at least one of the vertical and horizontal charge coupled devices is coincident with the crystal growth direction.

20. A semiconductor device comprising:
a photoelectric conversion formed over an insulating surface;
a charge coupled device electrically connected to the photoelectric conversion device and formed over the insulating surface;
said charge coupled device including:
a crystalline semiconductor film formed on the insulating surface, said crystalline semiconductor film having a plurality of crystals extending in a crystal growth direction which is parallel to the insulating surface;
an insulating film on the crystalline semiconductor film;
a plurality of electrodes formed on the insulating film, each of said plurality of electrodes located within a predetermined distance so that a plurality of MOS capacitors are formed between the plurality of electrodes and the crystalline semiconductor film with the insulating film therebetween,
wherein a charge is transferred from one of the MOS capacitors to another of the MOS capacitors in a charge transfer direction,
wherein the charge transfer direction is coincident with the crystal growth direction.

21. A semiconductor device comprising:
a photoelectric conversion formed over a transparent substrate;
a charge coupled device electrically connected to the photoelectric conversion device and formed over the insulating surface;
said charge coupled device including:
a crystalline semiconductor film formed on the insulating surface, said crystalline semiconductor film having a plurality of crystals extending in a crystal growth direction which is parallel to the insulating surface;
an insulating film on the crystalline semiconductor film;
a plurality of electrodes formed on the insulating film, each of said plurality of electrodes located within a predetermined distance so that a plurality of MOS capacitors are formed between the plurality of electrodes and the crystalline semiconductor film with the insulating film therebetween, and
an active matrix display device comprising a plurality of thin film transistors formed over the transparent substrate;
wherein a charge is transferred from one of the MOS capacitors to another of the MOS capacitors in a charge transfer direction,
wherein the charge transfer direction is coincident with the crystal growth direction.

\* \* \* \* \*

UNITED STATES PATENT AND TRADEMARK OFFICE
CERTIFICATE OF CORRECTION

PATENT NO.         : 7,943,968 B1
APPLICATION NO.    : 08/994038
DATED              : May 17, 2011
INVENTOR(S)        : Satoshi Teramoto et al.

It is certified that error appears in the above-identified patent and that said Letters Patent is hereby corrected as shown below:

Column 8, line 64, in claim 11 replace "su" with --so--.

Signed and Sealed this
Twenty-seventh Day of November, 2012

David J. Kappos
*Director of the United States Patent and Trademark Office*